(12) United States Patent
Pelly

(10) Patent No.: US 6,404,045 B1
(45) Date of Patent: Jun. 11, 2002

(54) IGBT AND FREE-WHEELING DIODE COMBINATION

(75) Inventor: Brian R. Pelly, Palos Verdes Estates, CA (US)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/417,383

(22) Filed: Oct. 13, 1999

Related U.S. Application Data

(62) Division of application No. 08/790,770, filed on Jan. 27, 1997.
(60) Provisional application No. 60/010,218, filed on Feb. 1, 1996.

(51) Int. Cl.[7] .......................... H01L 23/48; H01L 23/52; H01L 23/495; H01L 23/34; H01L 23/053
(52) U.S. Cl. ...................... 257/690; 257/608; 257/691; 257/701; 257/723
(58) Field of Search ................................ 257/723, 668, 257/691, 690, 701

(56) References Cited

U.S. PATENT DOCUMENTS

| 5,459,356 A | | 10/1995 | Schulze et al. | |
|---|---|---|---|---|
| 5,616,955 A | * | 4/1997 | Yamada et al. | 257/690 |
| 5,661,343 A | * | 8/1997 | Takahashi et al. | 257/723 |
| 5,767,576 A | * | 6/1998 | Kobayashi et al. | 257/701 |
| 5,998,227 A | | 12/1999 | Pelly | |
| 6,166,937 A | * | 12/2000 | Yamamura et al. | 363/141 |

FOREIGN PATENT DOCUMENTS

| JP | 7231071 | 8/1995 |
|---|---|---|
| JP | 7297362 | 11/1995 |

OTHER PUBLICATIONS

ISHM '95 Proceedings— "Variational Solid Modeling of Metal Matrix Composite High Current Power Modules", James M. Fusaro, Joe L. Martinez, Guillermo L. Romero, pp. 217–222.

* cited by examiner

Primary Examiner—Jerome Jackson, Jr.
Assistant Examiner—Jesse A. Fenty
(74) Attorney, Agent, or Firm—Ostrolenk, Faber, Gerb & Soffen, LLP

(57) ABSTRACT

A combination of an IGBT and an antiparallel-connected freewheeling diode in which the IGBT die size is greater than about twice the diode die size. Preferably the diode die size is about 10%–25% of that of the IGBT. The respective die sizes of an IGBT and an antiparallel connected freewheeling diode may be adjusted by the steps of: determining respective initial die sizes for the IGBT and the diode; increasing the IGBT die size from the initial value; and reducing said diode die size from the initial value. The IGBT die size is increased sufficiently to reduce current density, conduction losses and switching losses in the IGBT. The diode die size is reduced sufficiently to reduce the reverse recovery charge of the diode so as to further reduce switching losses in the IGBT, to a minimum size which is sufficient to carry the antiparallel current without substantial overheating. The adjustment of the diode die size is advantageous either independently of, or in combination with, the adjustment of the IGBT die size. These adjustments are capable of reducing the switching energy of the IGBT and diode by about 30%–40% below that of a conventional IGBT-diode combination.

4 Claims, 4 Drawing Sheets

TYPICAL TURN-OFF ENERGY
VERSUS COLLECTOR CURRENT
FOR SIZE 3 AND SIZE 4 IGBTs

IGBT AND FREE-WHEELING DIODE COMBINATION

CROSS-REFERENCE TO RELATED APPLICATION

This application is related to U.S. Provisional Patent Application Serial No. 60/010,979 filed Feb. 1, 1996, the disclosures of which are incorporated by reference.

This is a division of application Ser. No. 08/790,770 filed Jan. 27, 1997, allowed.

FIELD OF THE INVENTION

This invention relates to copacked semiconductor die, and more specifically relates to improvements in the sizes of an IGBT and an anti-parallel connected free-wheeling diode therefor.

BACKGROUND OF THE INVENTION

The use of IGBTs and corresponding anti-parallel free-wheeling diodes is well known for many circuits, for example motor control circuits. The IGBT and diode die may be separately housed, or may be copacked on a common heatsink. The die size chosen for the diode is usually about half the die size of the IGBT to handle the anticipated losses which are expected to be produced during operation. It would be very desirable to reduce the losses produced by those two die as much as is economically feasible, in order to be able to mount the parts on printed circuit boards, rather than on more expensive IMS boards, and possibly to eliminate heat sinks.

SUMMARY OF THE INVENTION

In accordance with a first aspect of the invention, the IGBT die is made oversized for its application (preferably about 2–3 times the conventional size) so that it will operate at a lower current density and current rating than has been used conventionally.

In accordance with a second aspect of the invention, the free-wheeling diode die is made smaller than the conventional size which would ordinarily be used for the given application.

The IGBT is operated at low current density because the forward voltage drop $V_{CEON}$ is relatively low at low current density. Therefore, conduction losses are lower. Secondly, the turn-off "tail" current tends to disappear at low current density, which decreases switching losses.

At the same time, the anti-parallel free-wheeling diode die is made much smaller than conventionally and is made smaller than the IGBT die, preferably about 10%–25% the size of the IGBT die. This is made possible in part by the lower operating current and lower losses in the IGBT, which make the IGBT run cooler, enabling the diode size to be reduced.

On the other hand, it should be noted that in specific applications of the type considered here in which the operative current density of the diode is relatively low, the diode size may advantageously be reduced regardless of whether the IGBT size is increased as described above. The smaller diode die has a lower reverse recovery charge, resulting in a reduction in the IGBT turn-on losses, thus further reducing the total loss of the IGBT-diode combination.

By adjusting the sizes of either or both of the IGBT die and free-wheeling diode die as stated above, it is possible to reduce total device loss, making it possible, if desired, to mount the IGBT and diode on a printed circuit board, such as an FR-4 board, possibly without a heat sink, rather than on the IMS type board frequently used to dissipate the higher losses produced by the conventionally designed IGBT and diode die.

DETAILED DESCRIPTION OF AN EMBODIMENT OF THE INVENTION

Figure 1:
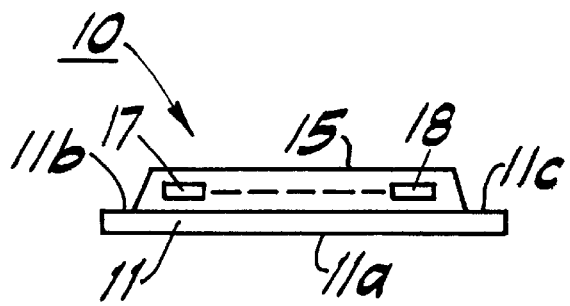
FIG. 1 is an end view of a surface mount package for mounting both an IGBT and an anti-parallel connected free-wheeling diode.
Figure 2:
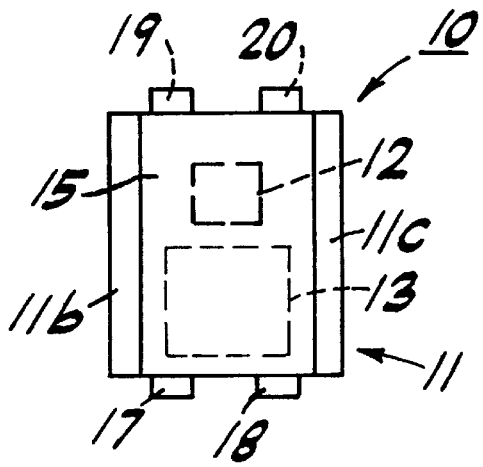
FIG. 2 is a top view of the package of FIG. 1, showing in phantom an IGBT and diode contained therein.

Referring first to FIGS. 1 and 2, there is shown a surface mount package 10, such as the SMD-10 package made by the International Rectifier Corporation of El Segundo, Calif. The package 10 has a conductor bottom plate 11 which has a solderable bottom 11a. The power semiconductor die 12 and 13 are mounted on the bottom plate 11. The die 12 and 13 are then interconnected, for example, by connection of their leads to a lead frame (not shown), and the device is then encapsulated by a molded insulation housing or cap 15. Suitable terminals, such as power terminals 17 and 18 and control terminals 19 and 20, extend out of the housing 15. Border strips 11b and 11c extend beyond the border of the housing 15.

Figure 3:
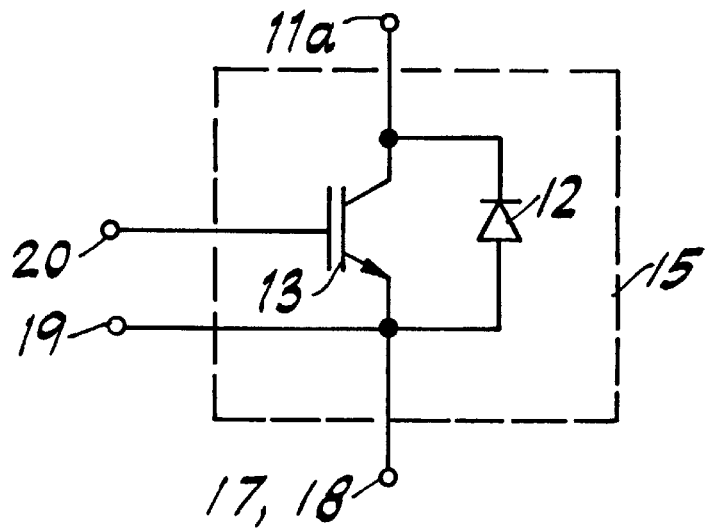
FIG. 3 is a circuit diagram of the IGBT and diode mounted within the package of FIGS. 1 and 2.

Typically, the die 12 and 13 can be a diode and an IGBT respectively connected in anti-parallel relationship, as shown in FIG. 3. FIG. 3 schematically shows the terminals 17 to 20 penetrating from the interior to the exterior of housing 15.

Conventionally, the IGBT die area would be about twice the area of the corresponding diode die, for example, which would have called for a size 3 IGBT die 13 and a size 20 HEXFRED diode 12, each made by the International Rectifier Corporation, for a given current rating. These values may be conventionally used with a motor current rating of 4 amperes, for example, but can be used with other current ratings depending on the particular structure of the device.

In accordance with an embodiment of the invention, and for the same given current rating, the IGBT die 13 is a size 4 IGBT die, made by the International Rectifier Corporation of El Segundo, Calif., while the anti-parallel connected diode die 12 is a size 10 HEXFRED fast recovery diode made by the International Rectifier Corporation of El Segundo, Calif.

Table 1 shows the dimensions of size 3, 4 and 7 IGBT's. Table 2 shows the dimensions of size 10 and 20 HEXFRED diodes.

TABLE 1

| IGBT Die/Size/ Number | 600 V | | | 1200 V | | |
|---|---|---|---|---|---|---|
| | Die Size in × in (cm × cm) | Total Die Area cm$^2$ | Active Area cm$^2$ | Die Size in × in (cm × cm) | Total Die Area cm$^2$ | Active Area cm$^2$ |
| 3 | 0.126 × 0.188 (0.320 × 0.478) | 0.153 | 0.079 | 0.133 × 0.195 (0.338 × 0.495) | 0.167 | 0.068 |
| 4 | 0.170 × 0.232 (0.432 × 0.589) | 0.254 | 0.156 | 0.170 × 0.243 (0.432 × 0.617) | 0.267 | 0.133 |
| 7 | N.A. | N.A. | N.A. | 0.340 × 0.340 (0.864 × 0.864) | 0.746 | 0.502 |

TABLE 2

| DIE | SIZE (mils) | SIZE (mm) |
|---|---|---|
| FRED10 | 90 × 90 | 2.29 × 2.29 |
| FRED20 | 106 × 130 | 2.69 × 3.30 |

The size 10 HEXFRED device die area has about 20% of the area of the size 4 IGBT. By using the larger size 4 IGBT and smaller size 10 HEXFRED diode, the total switching energy of the improved IGBT and diode combination can be reduced by more than about 30% of that of the normally designed combination at the same current.

Figure 4:
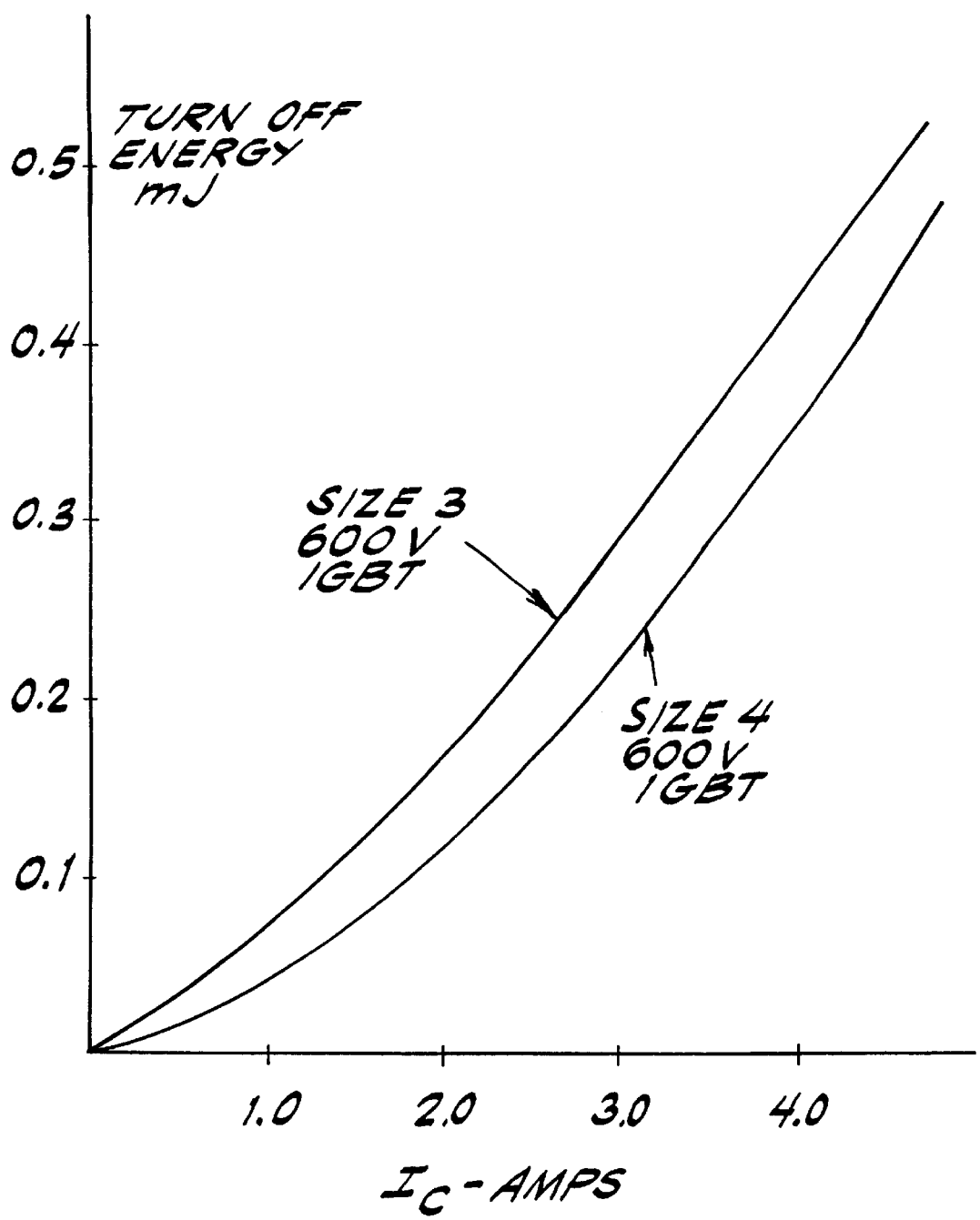
FIG. 4 is a graph showing typical turnoff switching energy vs. current for size 3 and size 4 IGBT's.

FIG. 4 is a graph showing typical turn-off switching energy versus collector current, for size 3 and size 4 600V IGBTs. The size 4 has lower turn-off energy at low current, because the turn-off tail energy becomes disproportionally smaller at lower current density. At higher current, the two curves tend to merge.

Figure 5A:
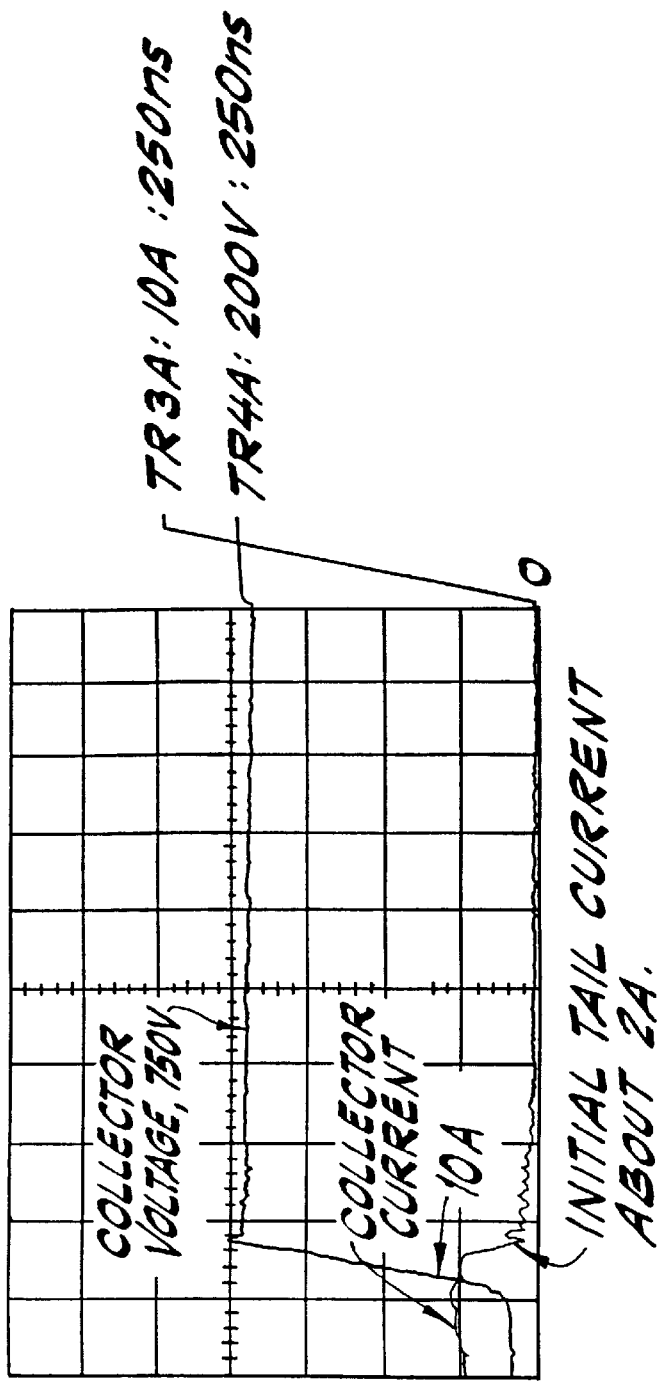
FIGS. 5(a) and 5(b) are graphs showing voltage and current during turnoff for a size 7 IGBT at 10A and 20A, respectively.
Figure 5B:
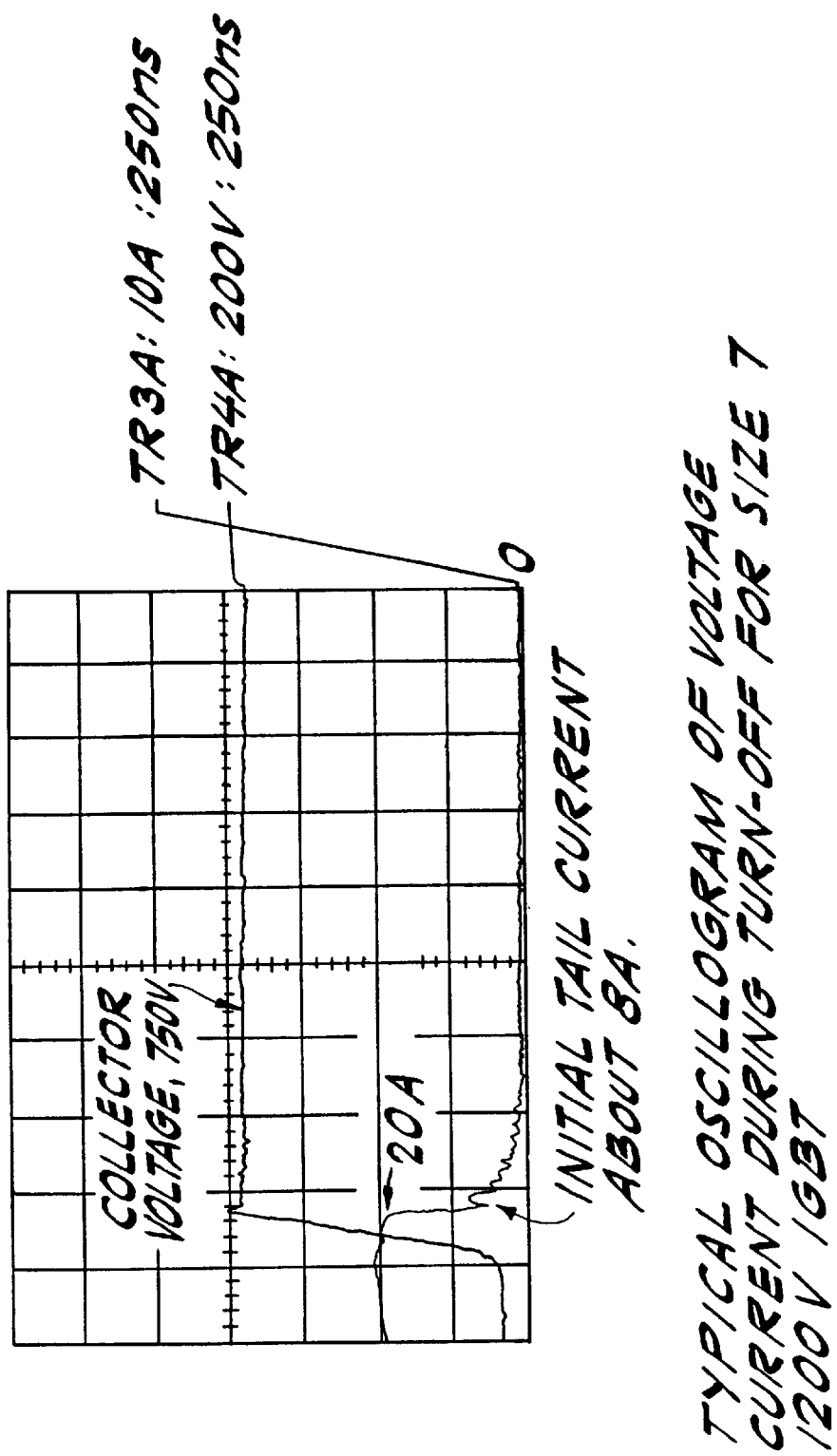

FIGS. 5(a) and 5(b) are graphs showing voltage and current during turn-off for a size 7 1200V IGBT. As shown, the tail losses are less significant at a low current density. When turning off 10A, the amplitude of the initial tail is about 2A; when turning off 20A, the amplitude of the initial tail is about 8A, i.e. a 4× increase in tail current occurs for a 2× increase in a current being turned off.

Considering the size of the diode, this should be no larger than needed to carry the current without overheating.

The switching losses due to diode recovery can be approximated as Qrr×Vdc×f, where Qrr is the recovery charge of the diode, Vdc is the dc supply voltage and f is the switching frequency. The larger the diode, the larger Qrr tends to be at a given load current, thus the greater the switching losses due to Qrr.

In summary, increasing the size of the IGBT reduces its loss contribution, while decreasing the size of the diode (within limits) reduces its loss contribution. Thus, a size 4 IGBT and a size 10 diode are well matched to minimize total losses in the example cited.

While the invention is shown for copacked die 12 and 13, the same advantages are obtained if the die 12 and 13 are separately packaged.

The invention as defined in the following claims is not limited by the foregoing description, but rather extends to all variations and modifications that may occur to an individual having ordinary skill in the art within the fair spirit and scope of the invention.

What is claimed is:

1. In combination, an IGBT and an antiparallel-connected freewheeling diode for operating at a predetermined operating current, said IGBT and said antiparallel-connected freewheeling diode having respective die size areas, wherein said die size area of said IGBT is greater than a rated IGBT die size area for said predetermined operating current, and said die size area of said diode is less than a rated diode die size area for said predetermined operating current;

wherein said IGBT has a current density and loss level such that said diode operates at said predetermined operating current without overheating; and wherein said IGBT and said diode are copackaged on a common bottom plate.

2. A combination as in claim 1, wherein said diode die size area is about 10%–25% of that of said IGBT.

3. A combination as in claim 1, wherein said diode die size area is a minimum size which is sufficient to carry said predetermined operating current to said freewheeling diode without overheating.

4. A combination as in claim 1, wherein said diode die size area is less than half the die size area of said IGBT.

* * * * *